United States Patent
Lim et al.

(10) Patent No.: US 7,969,023 B2
(45) Date of Patent: Jun. 28, 2011

(54) INTEGRATED CIRCUIT PACKAGE SYSTEM WITH TRIPLE FILM SPACER HAVING EMBEDDED FILLERS AND METHOD OF MANUFACTURE THEREOF

(75) Inventors: Taeg Ki Lim, Icheon (KR); JaEun Yun, Ichon (KR); Byung Joon Han, Singapore (SG)

(73) Assignee: Stats Chippac Ltd., Singapore (SG)

( * ) Notice: Subject to any disclaimer, the term of this patent is extended or adjusted under 35 U.S.C. 154(b) by 50 days.

(21) Appl. No.: 12/142,743

(22) Filed: Jun. 19, 2008

(65) Prior Publication Data

US 2009/0020893 A1    Jan. 22, 2009

Related U.S. Application Data

(60) Provisional application No. 60/950,105, filed on Jul. 16, 2007.

(51) Int. Cl.
*H01L 23/48* (2006.01)
*H01L 23/52* (2006.01)
*H01L 29/40* (2006.01)
*H01L 23/49* (2006.01)

(52) U.S. Cl. ............ 257/784; 257/E23.024; 257/786; 257/686; 257/777; 257/723; 257/734; 257/789; 257/790; 257/E27.137; 257/E23.021

(58) Field of Classification Search .......... 257/686, 257/777, 723, 784, 786, 737, 738, E23.024, 257/778, 789, 788, 790.791, 734, E27.137, 257/E23.021; 324/765
See application file for complete search history.

(56) References Cited

U.S. PATENT DOCUMENTS

| | | | |
|---|---|---|---|
| 6,019,627 A * | 2/2000 | Embo et al. ................. | 439/412 |
| 6,214,446 B1 * | 4/2001 | Funada et al. .............. | 428/212 |
| 6,388,313 B1 | 5/2002 | Lee et al. | |
| 6,472,758 B1 * | 10/2002 | Glenn et al. ................ | 257/777 |
| 6,503,776 B2 | 1/2003 | Pai et al. | |
| 6,657,290 B2 | 12/2003 | Fukui et al. | |
| 6,710,455 B2 * | 3/2004 | Goller et al. ................ | 257/777 |
| 6,919,627 B2 * | 7/2005 | Liu et al. .................... | 257/686 |
| 6,943,294 B2 * | 9/2005 | Kang et al. .................. | 174/541 |
| 6,949,834 B2 * | 9/2005 | Connell et al. .............. | 257/777 |
| 7,166,924 B2 * | 1/2007 | Lu et al. ..................... | 257/777 |
| 7,244,675 B2 | 7/2007 | Honda et al. | |
| 7,276,799 B2 * | 10/2007 | Lee et al. .................... | 257/777 |
| 7,285,864 B2 * | 10/2007 | Takyu et al. ................ | 257/777 |
| 7,482,695 B2 * | 1/2009 | Takyu et al. ................ | 257/777 |

(Continued)

OTHER PUBLICATIONS

"McGraw-Hill dictionary of Scientific and Technical Terms, Sixth Edition", Sep. 26, 2002, p. 798 Publisher: McGraw-Hill, Published in: New York.

*Primary Examiner* — Alexander O Williams
(74) *Attorney, Agent, or Firm* — Mikio Ishimaru

(57) ABSTRACT

An integrated circuit package in package system includes: providing a substrate with a first wire-bonded die mounted thereover, and connected to the substrate with bond wires; mounting a triple film spacer above the first wire-bonded die, the triple film spacer having fillers in a first film and in a third film, and having a second film separating the first film and the third film, and the bond wires connecting the first wire-bonded die to the substrate are embedded in the first film; and encapsulating the first wire-bonded die, the bond wires, and the triple film spacer with an encapsulation.

20 Claims, 3 Drawing Sheets

U.S. PATENT DOCUMENTS

| | | | |
|---|---|---|---|
| 7,629,695 B2 * | 12/2009 | Yoshimura et al. | 257/777 |
| 2002/0109216 A1 * | 8/2002 | Matsuzaki et al. | 257/686 |
| 2003/0038355 A1 * | 2/2003 | Derderian | 257/686 |
| 2003/0189259 A1 * | 10/2003 | Kurita et al. | 257/777 |
| 2004/0163240 A1 * | 8/2004 | Frezza | 29/832 |
| 2004/0201088 A1 * | 10/2004 | Kim et al. | 257/686 |
| 2004/0222509 A1 * | 11/2004 | Ogata | 257/686 |
| 2005/0006785 A1 * | 1/2005 | Liu et al. | 257/777 |
| 2005/0023666 A1 * | 2/2005 | Ogata | 257/686 |
| 2005/0035461 A1 * | 2/2005 | Wu et al. | 257/777 |
| 2005/0205981 A1 * | 9/2005 | Yoshimura et al. | 257/686 |
| 2005/0224959 A1 * | 10/2005 | Kwon et al. | 257/723 |
| 2007/0052089 A1 * | 3/2007 | Kim et al. | 257/723 |
| 2007/0085184 A1 * | 4/2007 | Kwon et al. | 257/686 |
| 2008/0150120 A1 * | 6/2008 | Nishimura et al. | 257/690 |
| 2008/0241995 A1 * | 10/2008 | Fukui et al. | 438/109 |
| 2009/0111218 A1 * | 4/2009 | Takyu et al. | 438/109 |
| 2009/0315547 A1 * | 12/2009 | Abwa et al. | 324/244 |

* cited by examiner

INTEGRATED CIRCUIT PACKAGE SYSTEM WITH TRIPLE FILM SPACER HAVING EMBEDDED FILLERS AND METHOD OF MANUFACTURE THEREOF

CROSS-REFERENCE TO RELATED APPLICATION(S)

This application claims the benefit of U.S. Provisional Patent Application Ser. No. 60/950,105 filed on Jul. 16, 2007, and the subject matter thereof is hereby incorporated herein by reference thereto.

TECHNICAL FIELD

The present invention relates generally to integrated circuits and more particularly to integrated circuit systems with wire-in-film.

BACKGROUND ART

The rapidly growing portable electronics market, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one Terahertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package in package system including: providing a substrate with a first wire-bonded die mounted thereover, and connected to the substrate with bond wires; mounting a triple film spacer above the first wire-bonded die, the triple film spacer having fillers in a first film and in a third film, and having a second film separating the first film and the third film, and the bond wires connecting the first wire-bonded die to the substrate are embedded in the first film; and encapsulating the first wire-bonded die, the bond wires, and the triple film spacer with an encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
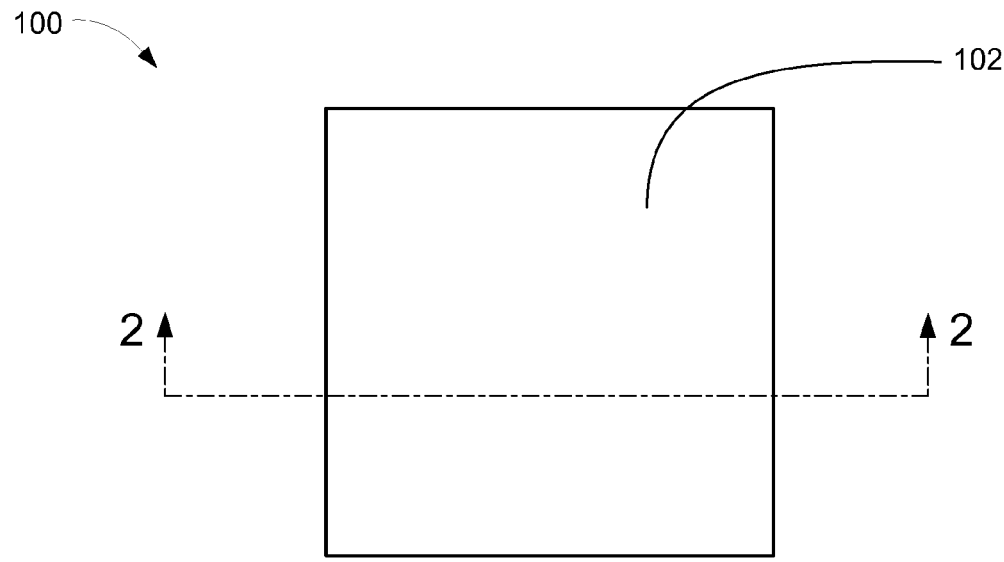
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

The term "system" as used herein refers to and is defined as the method and as the apparatus of the present invention in accordance with the context in which the term is used.

Referring now to FIG. 1, therein is shown a top view of an integrated circuit package system 100 in a first embodiment of the present invention. The integrated circuit package system 100 is shown having an encapsulation 102. The encapsulation 102, such as epoxy mold compound (EMC), protects sensitive components from moisture, dust and other contamination.

Figure 2:
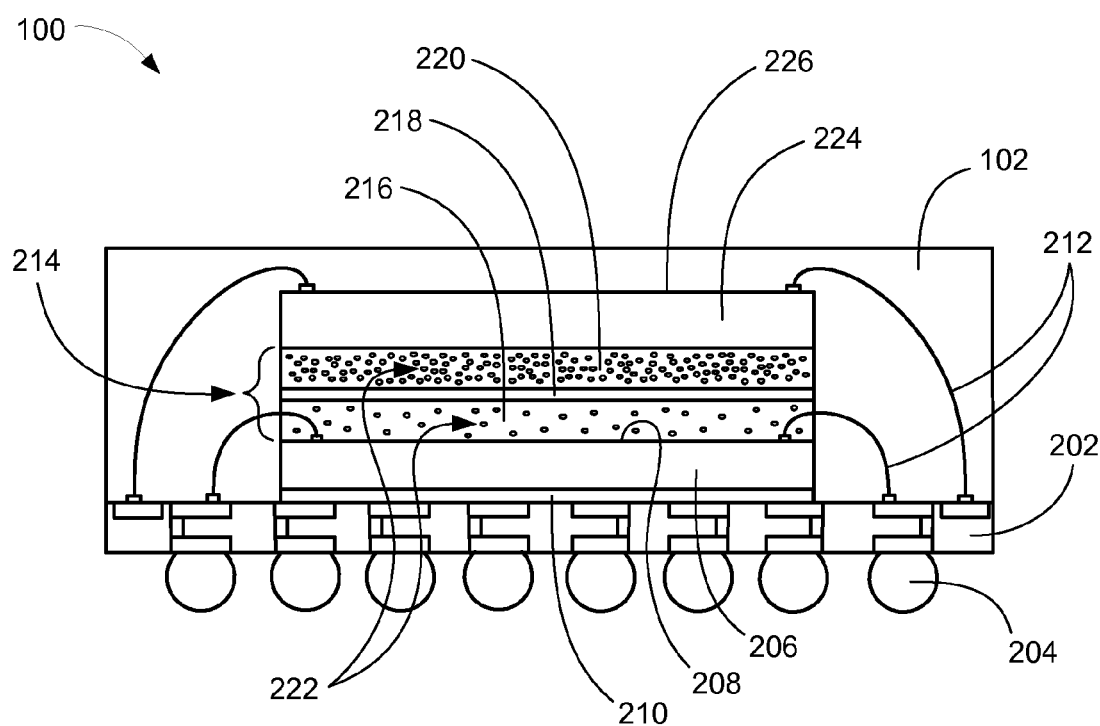
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is further shown having a substrate 202 such as a laminated plastic or ceramic substrate. Below the substrate 202, external interconnects 204 such as solder balls are mounted.

Above the substrate 202, a first wire-bonded die 206 with an active side 208, is attached to the substrate 202 with die attach adhesive 210. The active side 208 of the first wire-bonded die 206 is connected to the substrate 202 with bond wires 212.

Above the first wire-bonded die 206 is a triple film spacer 214. The triple film spacer 214 has a first film 216 that is attached to the active side 208 of the first wire-bonded die 206. Above the first film 216 is a second film 218. Above the second film 218 is a third film 220.

Fillers 222 are imbedded within the first film 216 and the third film 220. The fillers 222 change the physical properties of the first film 216 and the third film 220. The fillers 222 are incorporated to control the viscosity of the first film 216 and the third film 220 as well as other properties such as peel strength, bond line thickness (BLT), and density. The type and amount of fillers are chosen so that a practical bond line thickness will result.

The fillers 222 may be any material such as glass or polymeric micro-balloons, which can provide the required properties. Further, the weight percentage (wt %) of the fillers 222 may be changed to provide additional control of the density and the viscosity of the first film 216 and the third film 220.

For example, a first film 216 with a fillers 222 having a 40 wt % will have a higher density and lower viscosity than a first film 216 with a fillers 222 having a 20 wt %. It has been unexpectedly discovered that a range of 10-50 wt % is optimal. Further, to control the properties of the first film 216 and the third film 220, the fillers 222 may be of differing size.

The size of the fillers 222 is an important element in maintaining the desired BLT. The BLT is the average thickness of the bonding material. This thickness should be thick enough to allow the bond wires 212 to penetrate while not being deformed. It has been discovered that fillers 222 with sizes of below 20 μm wide helps to maintain the desired BLT.

Further, fillers 222 of these sizes show better reliability and peel strength, which equals better adhesion. The fillers 222 can be of any shape, such as spherical or conical. The first film 216 is shown having a lesser wt % of fillers 222 than the third film 220. This gives the third film 220 a higher density and a lower viscosity than the first film 216.

In addition, the first film 216 is more easily pressed around the bond wires 212, while the third film 220 offers added resistance to keep the bond wires 212 from penetrating through the triple film spacer 214. The bond wires 212 are shown embedded only in the first film 216 and underneath the second film 218.

The second film 218 separates the first film 216 and the third film 220. The second film 218 also compensates for any property mismatches that occur when the first film 216 and the third film 220 are of differing or incompatible materials.

Above the triple film spacer 214 is a second wire-bonded die 224 with an active side 226. The second film 218 of the triple film spacer 214 prevents shorts that may occur if the bond wires 212 were to contact the second wire-bonded die 224.

The active side 226 of the second wire-bonded die 224 is connected to the substrate 202 with the bond wires 212. The encapsulation 102 is shown encapsulating the bond wires 212, the first wire-bonded die 206, the second wire-bonded die 224, and the triple film spacer 214.

Figure 3:
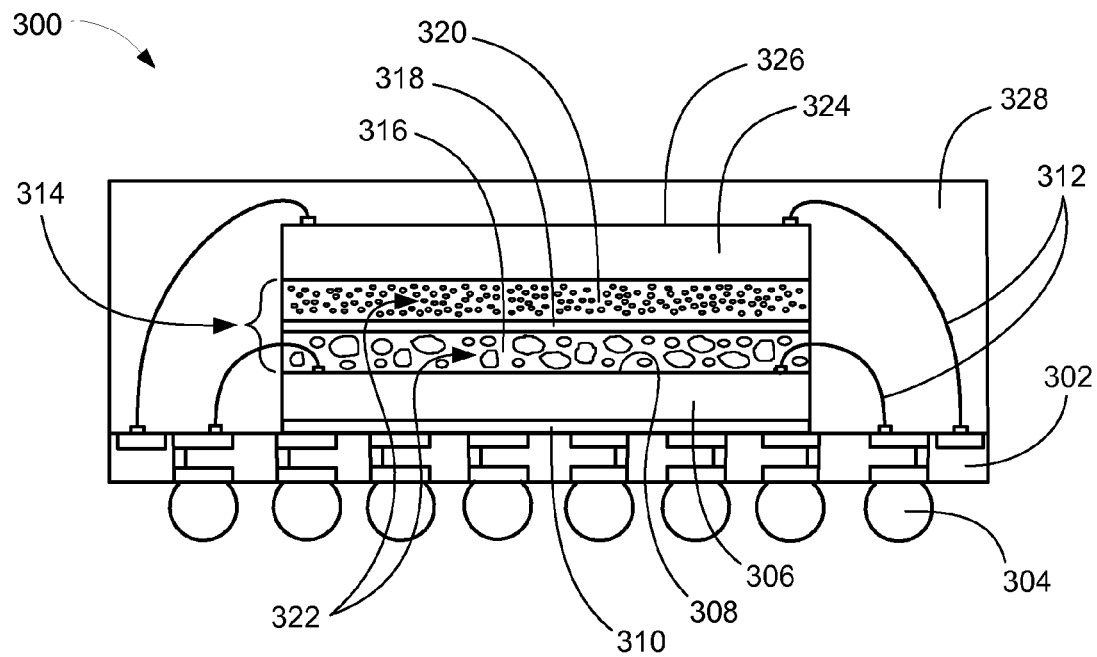
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 is shown having a substrate 302 such as a laminated plastic or ceramic substrate. Below the substrate 302, external interconnects 304 such as solder balls are mounted.

Above the substrate 302, a first wire-bonded die 306 with an active side 308, is attached to the substrate 302 with die attach adhesive 310. The active side 308 of the first wire-bonded die 306 is connected to the substrate 302 with bond wires 312.

Above the first wire-bonded die 306 is a triple film spacer 314. The triple film spacer 314 has a first film 316 that is attached to the active side 308 of the first wire-bonded die 306. Above the first film 316 is a second film 318. Above the second film 318 is a third film 320.

Fillers 322 are imbedded within the first film 316 and the third film 320. The fillers 322 change the physical properties of the first film 316 and the third film 320. The fillers 322 are incorporated to control the viscosity of the first film 316 and the third film 320 as well as other properties such as peel strength, bond line thickness (BLT), and density. The type and amount of fillers are chosen so that a practical bond line thickness will result.

The fillers 322 may be any material, such as glass or polymeric micro-balloons, which can provide the required properties. Further, the weight percentage (wt %) of the fillers 322 may be changed to provide additional control of the density and the viscosity of the first film 316 and the third film 320.

For example, a first film 316 with a fillers 322 having a 40 wt % will have a higher density and lower viscosity than a first film 316 with a fillers 322 having a 30 wt %. Still further, to control the properties of the first film 316 and the third film 320, the fillers 322 may be of differing size.

The size of the fillers 322 is an important element in maintaining the desired BLT. It has been discovered that fillers 322 with sizes of below 20 μm wide helps to maintain the desired BLT.

Further, fillers 322 of these sizes show better reliability and peel strength, which equals better adhesion. The fillers 322 can be of any shape, such as spherical or conical. The third film 320 is shown having smaller sized fillers 322 than the fillers 322 of the first film 316.

The second film 318 separates the first film 316 and the third film 320. The second film 318 also compensates for any property mismatches that occur when the first film 316 and the third film 320 are of differing or incompatible materials.

Above the triple film spacer 314 is a second wire-bonded die 324 with an active side 326. The second film 318 of the triple film spacer 314 prevents shorts that may occur if the bond wires 312 were to contact the second wire-bonded die 324.

The smaller fillers 322 in the third film 320 offers a better ability to adhere to the second wire-bonded die 324, while the larger fillers 322 of the first film 316 helps to ensure a BLT that will not put added stress or deformation of the bond wires 312. The bond wires 312 are shown embedded only in the first film 316 and underneath the second film 318.

The active side 326 of the second wire-bonded die 324 is connected to the substrate 302 with the bond wires 312. An encapsulation 328 is shown encapsulating the bond wires 312, the first wire-bonded die 306, the second wire-bonded die 324, and the triple film spacer 314.

Figure 4:
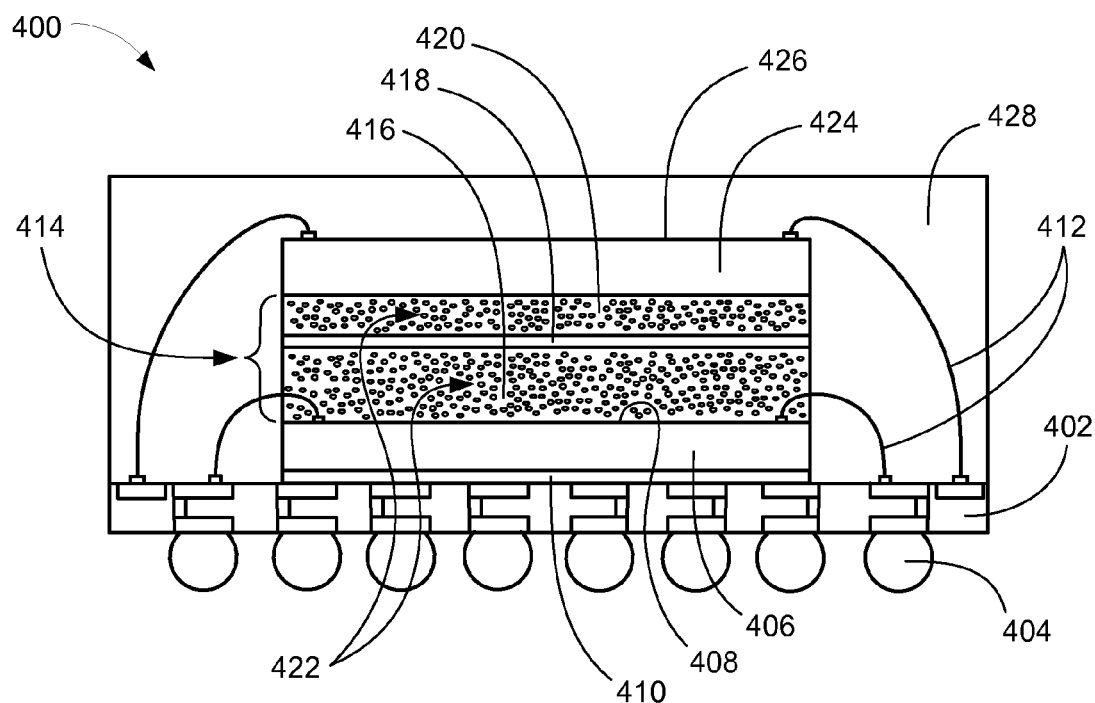
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 is shown having a substrate 402 such as a laminated plastic or ceramic substrate. Below the substrate 402, external interconnects 404 such as solder balls are mounted.

Above the substrate 402, a first wire-bonded die 406 with an active side 408, is attached to the substrate 402 with die attach adhesive 410. The active side 408 of the first wire-bonded die 406 is connected to the substrate 402 with bond wires 412.

Above the first wire-bonded die 406 is a triple film spacer 414. The triple film spacer 414 has a first film 416 that is attached to the active side 408 of the first wire-bonded die 406. Above the first film 416 is a second film 418. Above the second film 418 is a third film 420.

Fillers 422 are imbedded within the first film 416 and the third film 420. The fillers 422 change the physical properties of the first film 416 and the third film 420. The fillers 422 are incorporated to control the viscosity of the first film 416 and the third film 420 as well as other properties such as peel strength, bond line thickness (BLT), and density. The type and amount of fillers are chosen so that a practical bond line thickness will result.

The fillers 422 may be any material such as glass or polymeric micro-balloons, which can provide the required properties. Further, the weight percentage (wt %) of the fillers 422 may be changed to provide additional control of the density and the viscosity of the first film 416 and the third film 420.

For example, a first film 416 with a fillers 422 having a 40 wt % will have a higher density and lower viscosity than a first film 416 with a fillers 422 having a 40 wt %. Further, to control the properties of the first film 416 and the third film 420, the fillers 422 may be of differing size.

The size of the fillers 422 is an important element in maintaining the desired BLT. It has been discovered that fillers 422 with sizes of below 20 μm wide helps to maintain the desired BLT.

Further, fillers 422 of these sizes show better reliability and peel strength, which equals better adhesion. The fillers 422 can be of any shape, such as spherical or conical. The third film 420 is shown as smaller in thickness than the first film 416. This gives the first film 416 more room for the bond wires 412 to penetrate. The bond wires 412 are shown embedded only in the first film 416 and underneath the second film 418.

The second film 418 separates the first film 416 and the third film 420. The second film 418 also compensates for any property mismatches that occur when the first film 416 and the third film 420 are of differing or incompatible materials.

Above the triple film spacer 414 is a second wire-bonded die 424 with an active side 426. The second film 418 of the triple film spacer 414 prevents shorts that may occur if the bond wires 412 were to contact the second wire-bonded die 424.

The active side 426 of the second wire-bonded die 424 is connected to the substrate 402 with the bond wires 412. An encapsulation 428 is shown encapsulating the bond wires 412, the first wire-bonded die 406, the second wire-bonded die 424, and the triple film spacer 414.

Figure 5:
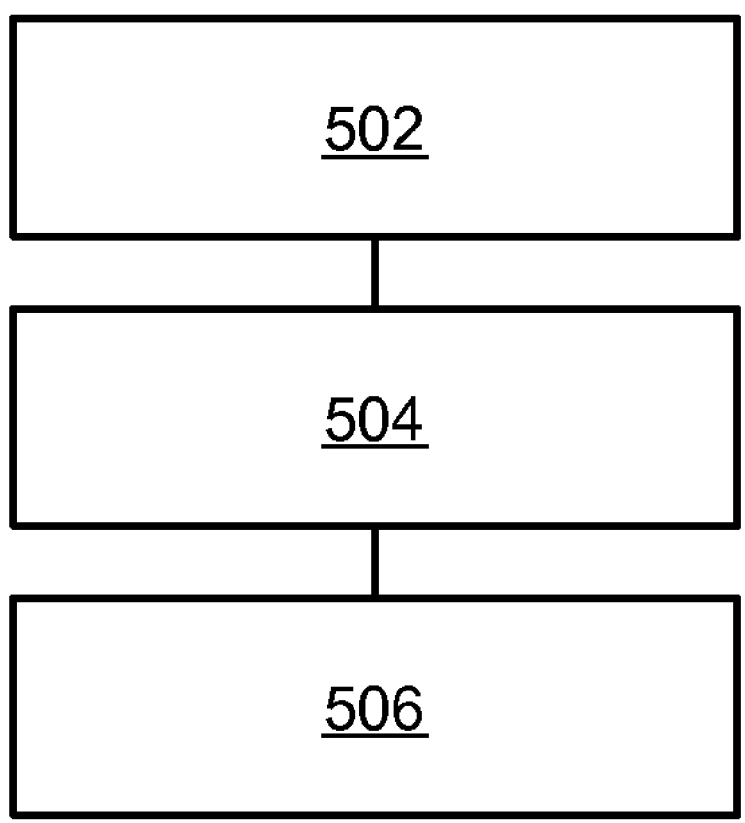
FIG. 5 is a flow chart of a system for manufacturing the integrated circuit package system of FIG. 1 in an embodiment of the present invention.

Referring now to FIG. 5, therein is shown a flow chart of a system 500 for manufacturing the integrated circuit package system 100 of FIG. 1 in an embodiment of the present invention. The system 500 includes providing a substrate with a first wire-bonded die mounted thereover, and connected to the substrate with bond wires in a block 502; mounting a triple film spacer above the first wire-bonded die, the triple film spacer having fillers in a first film and in a third film, and having a second film separating the first film and the third film, and the bond wires connecting the first wire-bonded die to the substrate are embedded in the first film in a block 504; and encapsulating the first wire-bonded die, the bond wires, and the triple film spacer with an encapsulation in a block 506.

Thus, it has been discovered that the triple film spacer of the present invention furnishes important and heretofore unknown and unavailable solutions, capabilities, and functional aspects for packaging high density wire-bonded die. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package in package system comprising:
   providing a substrate with a first wire-bonded die mounted thereover, and connected to the substrate with bond wires;
   mounting a triple film spacer above the first wire-bonded die, the triple film spacer having fillers in a first film and in a third film, and having a second film separating the first film and the third film, and the bond wires connecting the first wire-bonded die to the substrate are embedded only in the first film and underneath the second film; and
   encapsulating the first wire-bonded die, the bond wires, and the triple film spacer with an encapsulation.

2. The method as claimed in claim 1 wherein:
   mounting the triple film spacer includes mounting the triple film spacer with the first film having a lesser weight percentage of fillers than the weight percentage of fillers in the third film.

3. The method as claimed in claim 1 wherein:
   mounting the triple film spacer includes mounting the triple film spacer with the third film having smaller sized fillers than the fillers of the first film.

4. The method as claimed in claim 1 wherein:
   mounting the triple film spacer includes mounting the triple film spacer with the third film having a smaller thickness than the thickness of the first film.

5. The method as claimed in claim 1 wherein:
   mounting the triple film spacer includes mounting the triple film spacer having the fillers size maintain a bond line thickness allowing the bond wires to penetrate the first film and not be deformed.

6. A method for manufacturing an integrated circuit package in package system comprising:
   providing a substrate with a first wire-bonded die mounted thereover, and connected to the substrate with bond wires;
   mounting a triple film spacer above the first wire-bonded die, the triple film spacer having fillers in a first film and in a third film, and having a second film separating the first film and the third film, and the bond wires connecting the first wire-bonded die to the substrate are embedded only in the first film and underneath the second film;
   mounting a second wire-bonded die with an active side above the triple film spacer and connecting the active side of the second wire-bonded die to the substrate with the bond wires; and
   encapsulating the first wire-bonded die, the bond wires, and the triple film spacer with an encapsulation.

7. The method as claimed in claim 6 wherein:
   mounting the triple film spacer includes mounting the triple film spacer with the fillers comprised of glass or polymer.

8. The method as claimed in claim 6 wherein:
   mounting the triple film spacer includes mounting the triple film spacer with the fillers being between 10-50 weight percentage of the first film or the third film.

9. The method as claimed in claim 6 wherein:
   mounting the triple film spacer includes mounting the triple film spacer with the second film for compensating for any property mismatches that occur when the first film and the third film are of differing or incompatible materials.

10. The method as claimed in claim 6 wherein:
    mounting the triple film spacer includes mounting the triple film spacer with the fillers being a maximum 20 µm wide.

11. An integrated circuit package in package system comprising:
    a substrate with a first wire-bonded die mounted thereover, and connected to the substrate with bond wires;
    a triple film spacer mounted above the first wire-bonded die, the triple film spacer having fillers in a first film and in a third film, and having a second film separating the first film and the third film, and the bond wires connecting the first wire-bonded die to the substrate are embedded only in the first film and underneath the second film; and
    an encapsulation encapsulating the first wire-bonded die, the bond wires, and the triple film spacer.

12. The system as claimed in claim 11 wherein:
    the first film has a lesser weight percentage of fillers than the weight percentage of fillers in the third film.

13. The system as claimed in claim 11 wherein:
    the third film has smaller sized fillers than the fillers of the first film.

14. The system as claimed in claim 11 wherein:
    the third film is smaller in thickness than the thickness of the first film.

15. The system as claimed in claim 11 wherein:
    the fillers size maintains a bond line thickness allowing the bond wires to penetrate the first film and not be deformed.

16. The system as claimed in claim 11 further comprising:
    mounting a second wire-bonded die with an active side above the triple film spacer and connecting the active side of the second wire-bonded die to the substrate with the bond wires.

17. The system as claimed in claim 16 wherein:
    the fillers are glass or polymer.

18. The system as claimed in claim 16 wherein:
    the fillers are between 10-50 weight percentage of the first film or the third film.

19. The system as claimed in claim 16 wherein:
    the second film is used for compensating for any property mismatches that occur when the first film and the third film are of differing or incompatible materials.

20. The system as claimed in claim 16 wherein:
    the fillers are a maximum 20 µm wide.

* * * * *